(12) United States Patent
Park et al.

(10) Patent No.: US 7,419,764 B2
(45) Date of Patent: Sep. 2, 2008

(54) METHOD OF FABRICATING NANOIMPRINT MOLD

(75) Inventors: Jong Hyurk Park, Daegu (KR); Hyo Young Lee, Daejeon (KR); Nak Jin Choi, Daegu (KR); Jung Hyun Lee, Gyeonggi-do (KR); Gyeong Sook Bang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/505,395

(22) Filed: Aug. 17, 2006

(65) Prior Publication Data
US 2007/0128549 A1 Jun. 7, 2007

(30) Foreign Application Priority Data
Dec. 7, 2005 (KR) ............... 10-2005-0118792
Mar. 21, 2006 (KR) ............... 10-2006-0025683

(51) Int. Cl.
G03C 5/00 (2006.01)

(52) U.S. Cl. .............. 430/296; 430/302; 430/328; 430/942

(58) Field of Classification Search .......... 430/296, 430/942, 22, 302, 312, 328
See application file for complete search history.

(56) References Cited

U.S. PATENT DOCUMENTS

| 6,492,094 | B1 | 12/2002 | Bojko | |
| 6,541,182 | B1 * | 4/2003 | Louis Joseph Dogue et al. | 430/296 |
| 6,913,868 | B2 | 7/2005 | Bencher et al. | |
| 7,022,465 | B2 * | 4/2006 | Heidari | 430/320 |
| 2004/0090910 | A1 | 5/2004 | Hatakeyama et al. | |
| 2006/0186084 | A1 * | 8/2006 | Wang et al. | 216/11 |

FOREIGN PATENT DOCUMENTS

KR 1020050063638 6/2005

OTHER PUBLICATIONS

Schultz et al.; "Master replication into thermosetting polymers for nanoimprinting"; American Vacuum Society; Nov./Dec. 2000; pp. 3582-3585.
Steen et al.; "Looking into the Crystal Ball; Future Device Learning Using Hybrid E-Beam and Optical Lithography"; Emerging Lithographic Technologies; 2005; pp. 26-34.
Pisignano et al.; "Rigid organic molds for nanoimprint lithography by replica molding of high glass transition temperature polymers;" Jul./Aug. 2004; pp. 1759-1763.
Paek et al.; "Nanoimprinted Focusing Grating Coupler for an Ultra Slim Optical Pickup Head"; Japanese Journal of Applied Physics; 2005; pp. 3414-3415.
Masanori Kawamori et al.; "Nanoimprint Lithography using Hydrogen Silsequioxane(HSQ) Mold"; 28P-6-20; pp. 124-125.
Falco C. M. J. M. van Delft et al.; "Hydrogen silsesquioxane/novolak bilayer resist for high aspect ratio nanoscale electron-beam lithography"; J. Vac. Sci. Technol. B 18(6), Nov./Dec. 2000; pp. 3419-3423.
Andrew Jamieson et al.; "A Hydrogen Silsequioxane Bilayer Resist Process for Low-Voltage Electron Beam Lithography"; Advances in Resist Technology and Processing XIX, Theodore H. Fedynyshyn, Editor, Proceedings of SPIE vol. 4690 (2002); pp. 1171-1179.

* cited by examiner

*Primary Examiner*—Christopher G Young
(74) *Attorney, Agent, or Firm*—Lowe Hauptman Ham & Berner LLP

(57) ABSTRACT

Provided is a method of fabricating a nanoimprint mold which can form sub-100 nm fine pattern structures. The method includes forming patterns on a first substrate using an E-beam lithography (EBL) process, and transferring the patterns formed on the first substrate to a second substrate using a nanoimprint lithography (NIL) process to complete an NIL mold. Accordingly, the method can easily fabricate the nanoimprint mold at low costs on a quartz or glass substrate, which is not suitable for an EBL process to produce sub-100 nm patterns, by utilizing the advantages of the EBL process with a resolution of tens of nanometers.

17 Claims, 7 Drawing Sheets

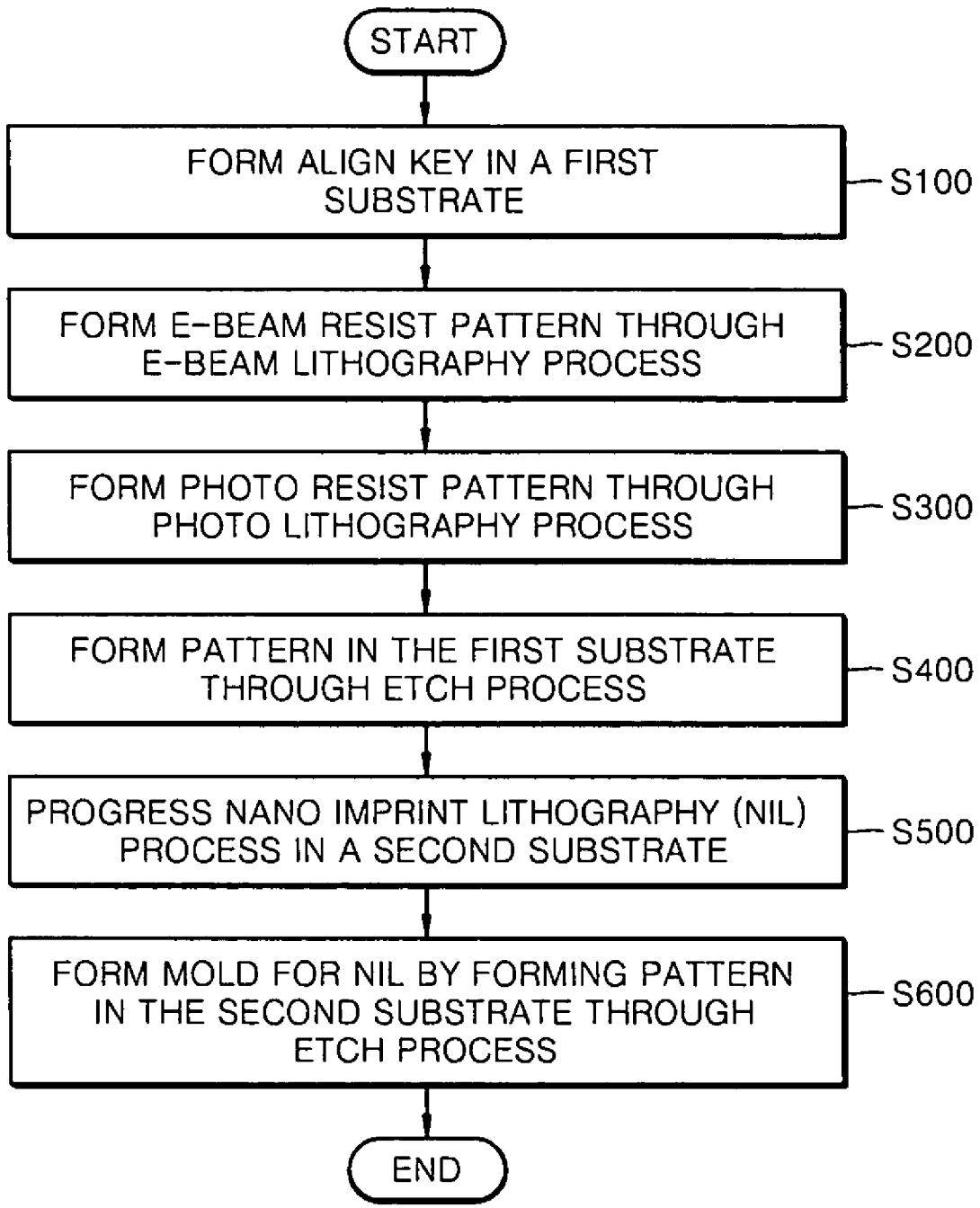

METHOD OF FABRICATING NANOIMPRINT MOLD

CROSS-REFERENCE TO RELATED PATENT APPLICATION

This application claims the benefit of Korean Patent Application Nos. 10-2005-0118792, filed on Dec. 7, 2005 and 10-2006-0025683, filed on Mar. 21, 2006 in the Korean Intellectual Property Office, the disclosures of which are incorporated herein in their entirety by reference.

BACKGROUND OF THE INVENTION

1. Field of the Invention

The present invention relates to nanoimprint technology, and more particularly, to a method of fabricating a nanoimprint mold which is essential to nanoimprint technology.

2. Description of the Related Art

Representative nanolithographic techniques for creating nanostructures with dimensions of less than 100 nm include electron beam (E-beam) lithography (EBL), focused ion beam lithography (FIBL), nanoimprint lithography (NIL), and deep UV (DUV) lithography. Recently, next-generation lithographic techniques such as extreme UV (EUV) lithography, X-ray lithography, hologram lithography, and laser interference lithography (LIL) have been developed.

EBL or FIBL with a resolution of several nanometers (nm) has disadvantages in that accelerated electrons or ions are greatly affected by the conductivity or structure of a substrate, and throughput is low due to raster or vector scanning.

DUV or EUV lithography which is mainly used in a semiconductor fabrication process and can generate wafer-scale patterns over a large area in a single step has disadvantages in that manufacturing equipment is expensive, costs of a photomask are high, and it is difficult to use a flexible substrate or material which is affected by a developer used for pattern formation after exposure.

X-ray lithography which is considered as next generation lithography can provide a diffraction limited resolution of several nanometers, which is higher than that of optical lithography and similar to that of the EBL or FIBL. However, the X-ray lithography is not suitable for forming patterns over a large area because it uses a very large synchrotron as an X-ray source and it is difficult to increase the size of the X-ray source.

LIL which is often used in forming repetitive patterns such as gratings can be easily applied to a large area, is rarely affected by the characteristics of a substrate, and can be achieved at low cost. Despite the advantages, the LIL cannot be widely used because it is difficult to form various patterns and requires strict overlay accuracy while performing a process of forming multi-layers.

Imprint lithography for forming patterns using a mold is largely divided into a thermal method and a UV curing method. The imprint lithography can be applied to a general semiconductor substrate, such as a silicon substrate, a plastic substrate requiring a low temperature process, and also to a non-conductive glass or quartz substrate.

Recently developed nanoimprint lithography has become an attractive alternative to hot embossing lithography because of its easy control of pressure or temperature, and particularly, UV nanoimprint lithography can produce patterns even at room temperature and under normal pressure.

However, the UV nanoimprint lithography requires a transparent substrate or mold which is generally formed of quartz. It is difficult to form sub-100 nm fine patterns over a large area of the quartz mold or substrate, thereby increasing manufacturing costs.

SUMMARY OF THE INVENTION

The present invention provides a method of fabricating a nanoimprint mold, which can form sub-100 nm fine patterns over a large area by a simple process.

The present invention also provides a method of fabricating a nanoimprint mold, which can simultaneously form patterns both below and above 100 nm.

According to an aspect of the present invention, there is provided a method of fabricating a nanoimprint mold comprising: forming patterns on a first substrate using an E-beam lithography (EBL) process; and transferring the patterns formed on the first substrate to a second substrate using a nanoimprint lithography (NIL) process to complete an NIL mold.

The forming of the patterns on the first substrate may comprise forming patterns greater than 100 nm on the first substrate using the photo-lithography process.

The patterns less than 100 nm may be formed using an electron beam (E-beam) resist formed on the first substrate and the patterns greater than 100 nm may be formed using a photo resist (PR), and the E-beam resist and the photo resist are not be affected by each other during exposure and development processes.

The first substrate may be a silicon substrate suitable for the EBL process, and the second substrate may be a glass or quartz substrate suitable for the NIL process. Preferably, the second substrate may be a quartz substrate.

The forming of the patterns on the first substrate may comprise: coating an E-beam resist on the first substrate and forming E-beam resist patterns using an EBL process; forming PR patterns using a photo-lithography process on the first substrate on which the E-beam resist patterns are formed; and transferring the E-beam resist patterns and the PR patterns formed on the first substrate to a second substrate using an NIL process to complete an NIL mold.

The E-beam resist patterns may be less than 100 nm and the PR patterns may be greater than 100 nm. Accordingly, the NIL mold may be completed by transferring the E-beam resist patterns of less than 100 nm and the PR patterns of greater than 100 nm to the second substrate and forming an NIL mold on which patterns both below and above 100 nm are formed simultaneously.

The method may further comprise forming alignment keys on the first substrate to achieve alignment between the E-beam resist patterns and the PR patterns, before coating an E-beam resist.

Accordingly, the method can be used to fabricate the NIL mold on which the fine patterns less than 100 nm and the large patterns greater than 100 nm are simultaneously formed using the E-beam lithography process and the photo-lithography process.

BRIEF DESCRIPTION OF THE DRAWINGS

The above and other features and advantages of the present invention will become more apparent by describing in detail exemplary embodiments thereof with reference to the attached drawings in which:

FIG. 1 is a flow chart illustrating a method of fabricating a nanoimprint mold according to an embodiment of the present invention;

DETAILED DESCRIPTION OF THE INVENTION

Figure 2A:
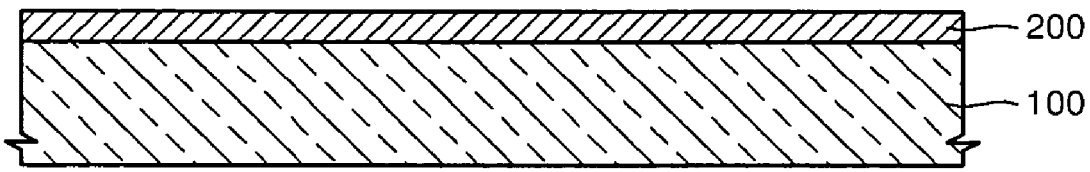
FIGS. 2A through 2F are cross-sectional views illustrating a method of fabricating a nanoimprint mold according to an embodiment of the present invention.

The present invention will now be described more fully with reference to the accompanying drawings, in which exemplary embodiments of the invention are shown. It will also be understood that when an element is referred to as being "on" another element, it can be directly on the element, or intervening elements may also be present therebetween. Also, the thicknesses or sizes of constituent elements shown in the drawings may be exaggerated for a better understanding of the present invention. Like reference numerals denote like elements in the drawings. Terms or embodiments used herein do not limit the scope of the present invention which is to be defined by the appended claims, but are provided to thoroughly and completely describe the present invention.

FIG. 1 is a flow chart illustrating a method of fabricating a nanoimprint mold on which patterns both below and above 100 nm are formed according to an embodiment of the present invention.

Referring to FIG. 1, in operation S100, an alignment key process is performed on a first substrate to achieve precise alignment between electron beam (E-beam) resist patterns and photo resist (PR) patterns which are to be formed later. The alignment key process is performed by coating a PR on the first substrate, forming PR patterns using a photo-lithography process, and forming alignment keys using a dry etching process.

In operation S200, E-beam resist patterns are formed using an E-beam lithography (EBL) process. The EBL process is performed by coating an E-beam resist on the first substrate, exposing, and developing the resultant structure with a developer. Accordingly, the first substrate may be a silicon substrate ideal for the EBL process. The E-beam resist patterns have dimensions less than 100 nm.

In operation S300, PR patterns are formed using a photo-lithography process. In detail, the PR patterns are formed by coating a PR on the E-beam resist patterns, and performing exposure and development processes. The PR patterns have dimensions greater than 100 nm, generally of a few micrometers (μm).

The E-beam resist and the PR are spin-coated in the EBL process and the photo-lithography process, respectively, and the two resists are not be affected by each other during the exposure and development processes.

In operation S400, patterns are formed on the first substrate using the E-beam resist patterns and the PR patterns as etch stop masks. The patterns formed on the first substrate include patterns both below and above 100 nm which are simultaneously formed by the E-beam resist patterns and the PR patterns, respectively.

In operation S500, a nanoimprint lithography (NIL) process is performed by coating an NIL resist on a second substrate, transferring the patterns formed on the first substrate using a thermal or ultraviolet (UV) imprint method, and forming NIL resist patterns.

In operation S600, patterns are formed on the second substrate by an etching process using the NIL resist patterns as masks to complete an NIL mold. Since the completed NIL mold is used to transfer fine patterns in an NIL process to an element that requires other sub-100 nm fine patterns, the second substrate may be formed of a material suitable for an NIL process, especially a UV NIL process, and generally may be a quartz substrate.

Since the method of the present embodiment uses the first substrate suitable for the EBL process to form fine patterns, the method can easily fabricate a nanoimprint mold. Also, since the method of the present embodiment uses the photo-lithography process, it can fabricate a nanoimprint mold on which patterns with dimensions both below and above 100 nm are formed.

FIGS. 2A through 2F are cross-sectional views illustrating a method of fabricating a nanoimprint mold according to an embodiment of the present invention.

Referring to FIG. 2A, an E-beam resist 200 for an EBL process is coated on a first substrate 100. The first substrate 100 may be formed of a material suitable for the EBL process, and is a silicon substrate in the present embodiment. The E-beam resist 200 may be spin-coated into a single layer of hydrogen silsesquioxane (HSQ).

The thickness of the E-beam resist 200 can be controlled by adjusting the concentration of HSQ and spin speed. A solvent may be methyle isobutyle ketone (MIBK). In the present embodiment, a thin HSQ film with a thickness of approximately 100 nm is formed using flowable oxide (FOX) as the HSQ by spin coating at 5000 rpm for 30 seconds.

Figure 2B:
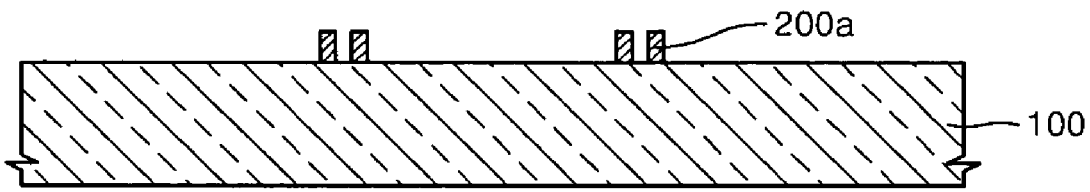

Referring to FIG. 2B, the E-beam resist 200 is exposed by an E-beam and developed to form E-beam resist patterns 200a. Before the exposure, the E-beam resist 200 may be prebaked for 2 minutes at temperatures of both 150° C. and 200° C. The exposure is performed by irradiating an E-beam at 100 kV and 100 pA. An unpatterned area of the E-beam resist 200 is removed with an aqueous tetramethylammonium hydroxide (TMAH)-based developer. The E-beam resist patterns 200 are sub-100 nm fine patterns.

Figure 2C:
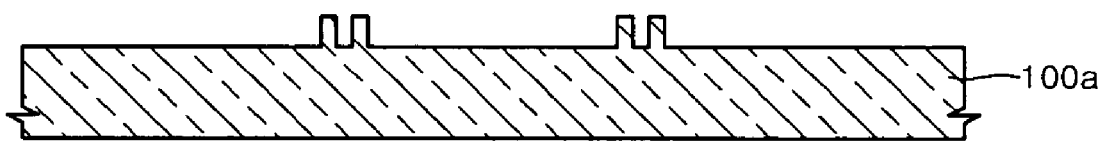

Referring to FIG. 2C, the first substrate 100 is dry-etched using the E-beam resist patterns 200a as etch stop masks to form a first substrate 100a on which the fine patterns are formed.

Figure 2D:
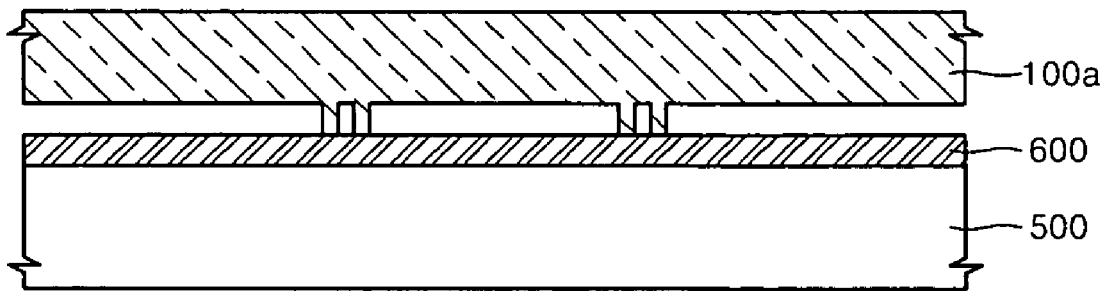

Referring to FIG. 2D, an NIL resist 600 is coated on a second substrate 500, the first substrate 100a with the fine patterns is attached to the second substrate 500 on which the NIL resist 600 is coated, and an NIL process is performed. The NIL process may be performed by using a thermal method that applies heat and pressure or by using a UV method that emits UV rays. The UV NIL process can be performed at room temperature and under normal pressure.

The NIL resist 600 is generally formed of a polymer resin. In the UV NIL process, the NIL resist 600 may be formed of a UV-curable polymer. The NIL resist 600 may be coated by various techniques, such as spin coating, droplet dispensing, and spraying, and preferably may be spin-coated.

Since the second substrate 500 is used as a mold for a subsequent NIL process of an element that requires sub-100 nm fine patterns, the second substrate 500 should be formed of a material suitable for the NIL process. In general, for a UV NIL process, the second substrate 500 may be a quartz, glass, sapphire, or diamond substrate through which UV rays can be transmitted, and preferably may be a quartz substrate.

Figure 2E:
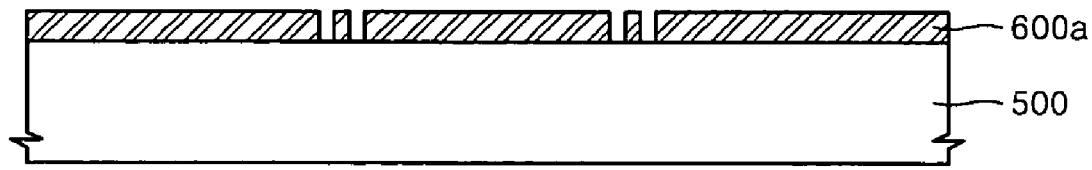

Referring to FIG. 2E, after the NIL process is complete, the first substrate 100a with the fine patterns is separated from the second substrate 500 to form NIL resist patterns 600a.

Figure 2F:
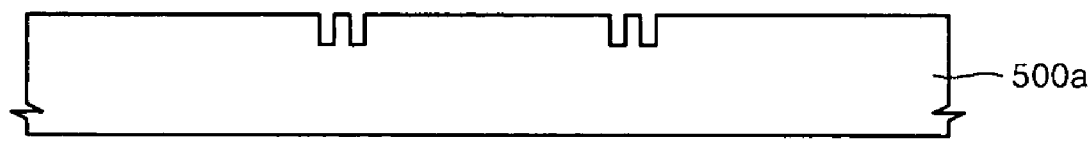

Referring to FIG. 2F, the resultant second substrate 500 is dry-etched using the NIL resist patterns 600a as etch stop masks to form an NIL mold 500a with fine patterns. The fine patterns are less than 100 nm as described above.

It is difficult to form fine patterns on a quartz NIL mold by EBL process because the quartz NIL mold is non-conductive. However, the method according to the present embodiment can easily fabricate the quartz NIL mold by utilizing the silicon substrate suitable for the EBL process and performing the EBL and NIL processes.

FIGS. 3A through 3G are cross-sectional views illustrating a method of fabricating a nanoimprint mold according to another embodiment of the present invention. An explanation of the same processes as those in the embodiment of FIGS. 2A through 2F will be omitted or made briefly for convenience.

Figure 3A:
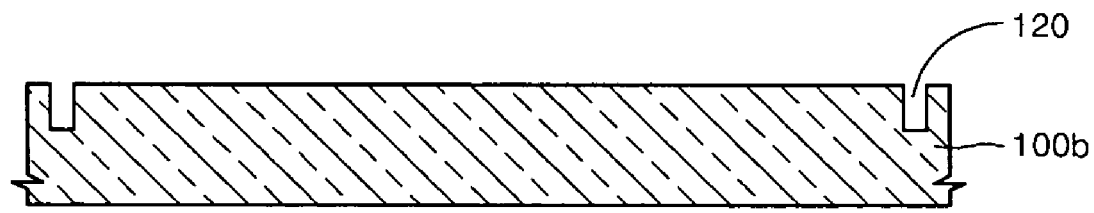
FIGS. 3A through 3G are cross-sectional views illustrating a method of fabricating a nanoimprint mold according to another embodiment of the present invention.

Referring to FIG. 3A, alignment keys 120 are formed on a first substrate 100b. The alignment keys 120 are generally formed by a photo-lithography process or an etching process to achieve alignment between E-beam resist patterns and PR patterns which are to be formed later. Accordingly, alignment keys for the E-beam resist patterns and the PR patterns may be formed simultaneously.

Figure 3B:
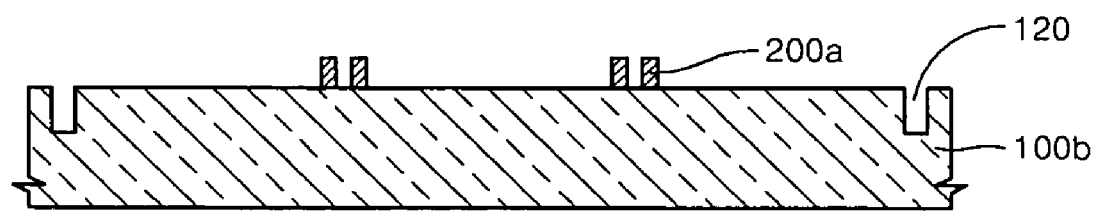

Referring to FIG. 3B, E-beam resist patterns 200a are formed using an EBL process. The E-beam resist patterns 200a are formed in the same manner as those in FIGS. 2A through 2F.

Figure 3C:
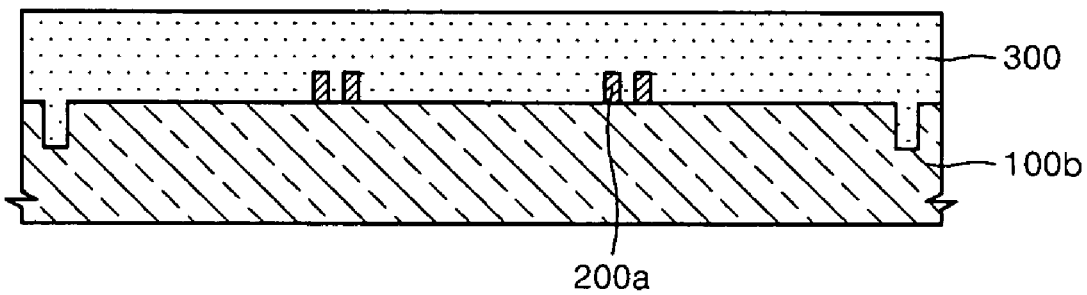

Referring to FIG. 3C, a PR 300 is coated over the entire surface of the first substrate 100b on which the E-beam resist patterns 200a are formed. The PR 300 is coated using a photo-lithography process to form large patterns such as pads or interconnection patterns. As described above, the PR 300 should be formed of a material which does not affect an E-beam resist during exposure and development processes, and may be formed to a thickness greater than that of the E-beam resist patterns 200a.

Figure 3D:
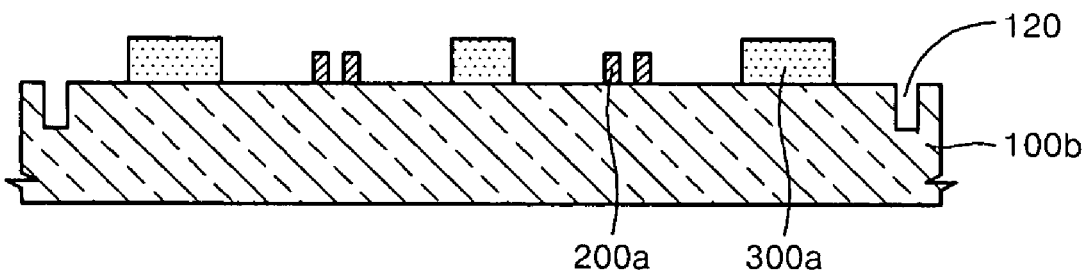

Referring to FIG. 3D, large PR patterns 300a are formed by performing a photo-lithography process.

Figure 3E:
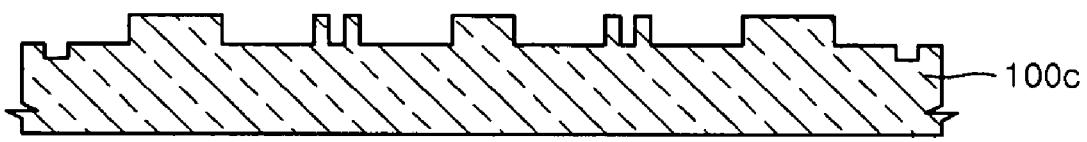

Referring to FIG. 3E, the resultant structure 100b is dry-etched using the E-beam resist patterns 200a and the PR patterns 300a as etch stop masks to form a first substrate 100c on which the fine and large patterns are formed. Accordingly, the fine patterns less than 100 nm and the large patterns greater than 100 nm, for example, a few micrometers (μm), are simultaneously formed on the first substrate 100c.

Figure 3F:
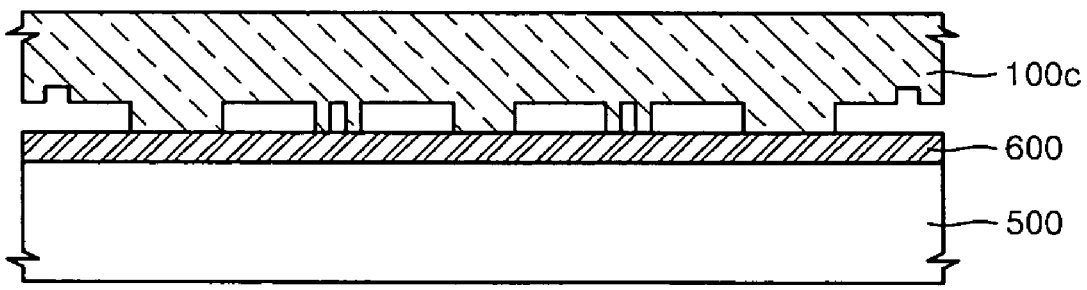
Figure 3G:

Referring to FIG. 3F, the first substrate 100c is attached to a second substrate 500 on which an NIL resist 600 is formed. Referring to FIG. 3G, an NIL process is performed to complete an NIL mold 500b on which the fine patterns and the large patterns are simultaneously formed.

As described above, in the present embodiment, the first substrate 100b and the second substrate 500 should be formed of appropriate materials, and particularly, the first substrate 100b may be a substrate suitable for the EBL process and the photo-lithography process. Also, the E-beam resist, the PR, and the NIL resist may be formed of appropriate materials in appropriate manners.

The method of the present embodiment can be used to fabricate the NIL mold on which the patterns both below and above 100 nm are simultaneously formed by using the first substrate 100b suitable for both the EBL process and the photo-lithography process, performing the EBL and the photo-lithography processes, and transferring the patterns to the second substrate 500.

Figure 4A:
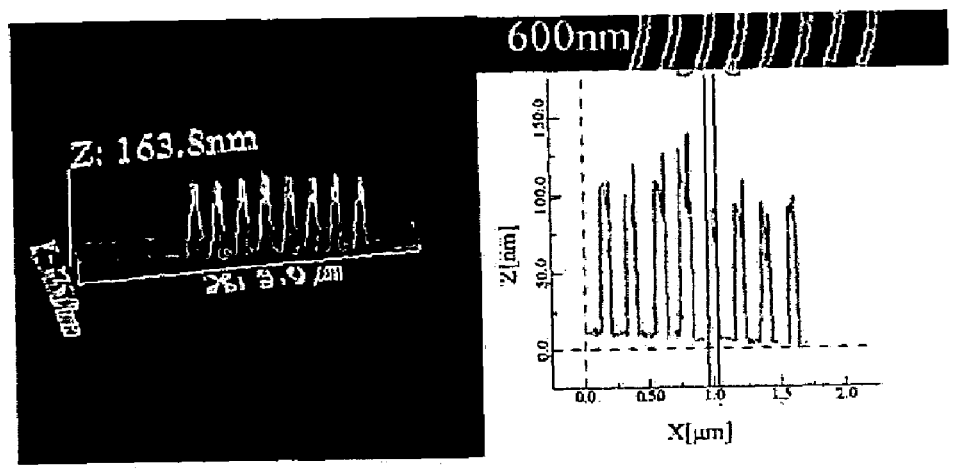
FIG. 4A is an atomic force microscope (AFM) photograph and a two-dimensional graph of the silicon mold fabricated by the method of FIGS. 2A through 2F.

FIG. 4A is an atomic force microscope (AFM) photograph and a two-dimensional graph of a silicon mold according to an embodiment of the present invention.

Referring to FIG. 4A, it can be seen from the left photograph that three-dimensional fine patterns are formed on a silicon substrate. It can be seen from the right graph that an aspect ratio of about 2:1 and a pattern width of about 50 nm/50 nm is achieved. A photograph over the right graph is a two-dimensional AFM photograph obtained by viewing the fine patterns along an x-y plane.

Figure 4B:
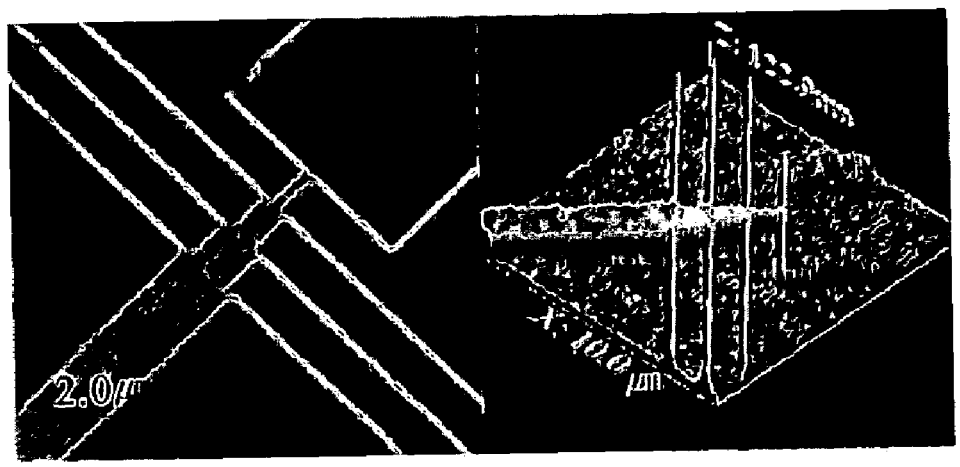
FIG. 4B is two-dimensional and three-dimensional AFM photographs of the silicon mold fabricated by the method of FIGS. 3A through 3G.

FIG. 4B is two-dimensional and three-dimensional AFM photographs of a silicon mold according to another embodiment of the present invention.

Referring to FIG. 4B, bright portions on the left two-dimensional photograph and the right three-dimensional photograph are places where patterns are formed, and a wider portion in the bright portions is a place where a plurality of fine patterns are formed.

Figure 5A:
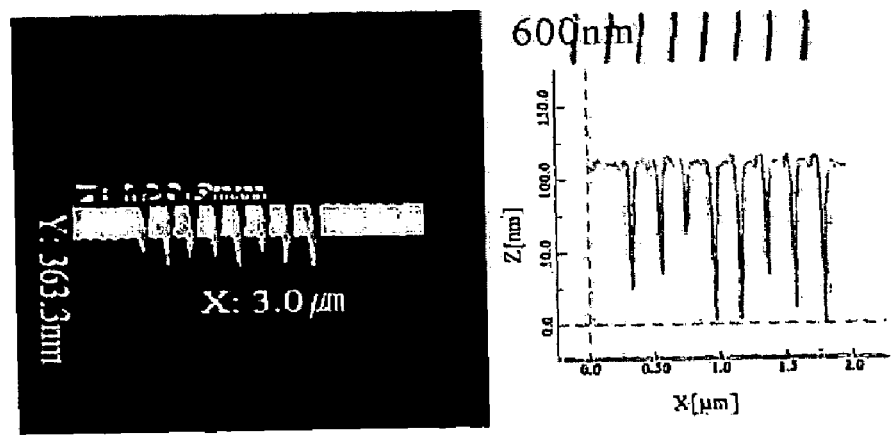
FIG. 5A is an AFM photograph and a two-dimensional graph of a quartz nanoimprint lithography (NIL) mold fabricated by an NIL process using the silicon mold of FIG. 4A.

FIG. 5A is an AFM photograph and a two-dimensional graph of a quartz NIL mold fabricated by an NIL process using the silicon mold of FIG. 4A. Referring to FIG. 5A, the patterns formed on the silicon substrate of FIG. 4A are transferred to a quartz NIL mold so that fin patterns are formed on the quartz NIL mold.

Figure 5B:
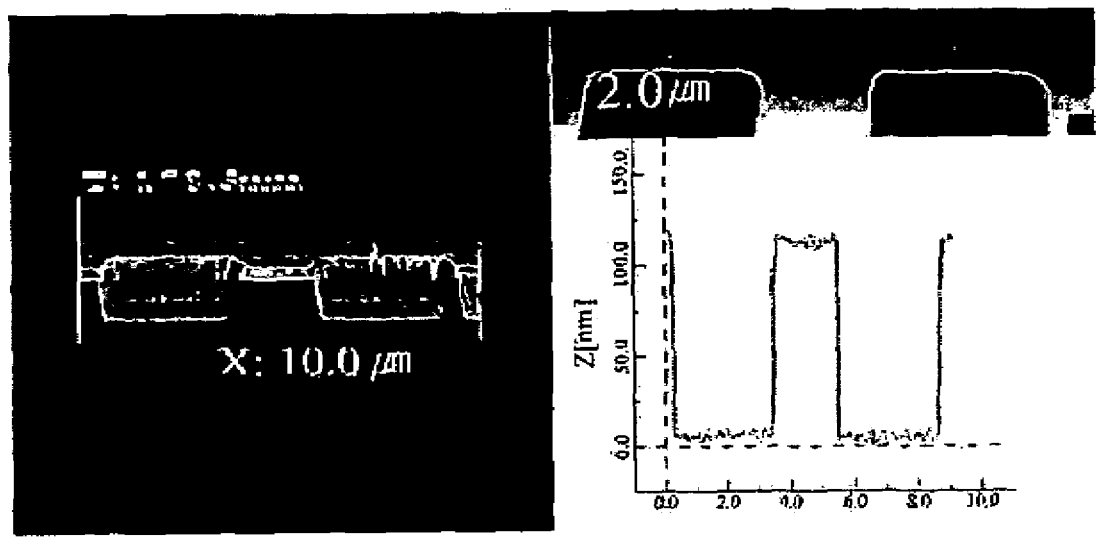
FIG. 5B is an AFM photograph and a two-dimensional graph of a quartz NIL mold on which patterns of a few micrometers (μm) are formed.

FIG. 5B is an AFM photograph and a two-dimensional graph of a quartz NIL mold on which large patterns of a few micrometers (μm) are formed. Referring to FIG. 5B, large patterns of a few micrometers (μm) are shown. Two rectangular portions in the left photograph are places where the large patterns are formed by a downward etching process.

Figure 5C:
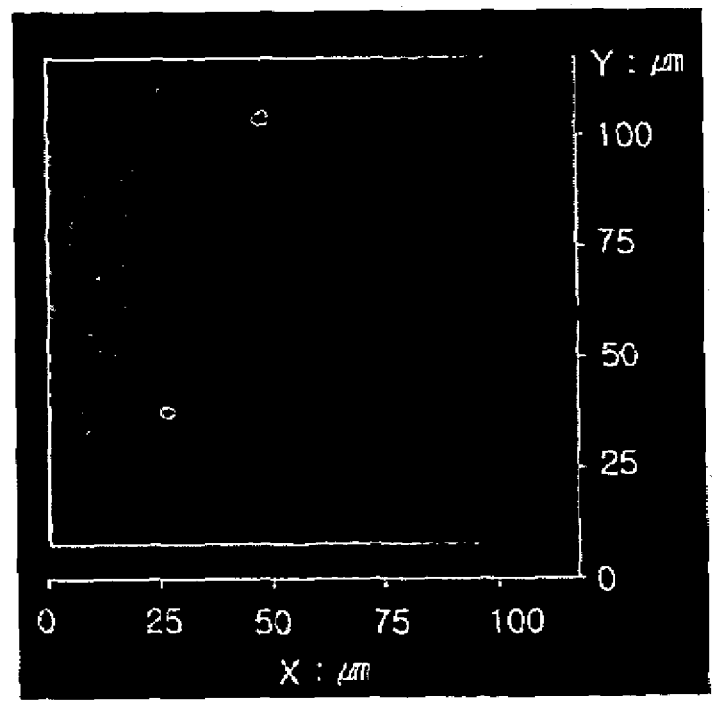
FIG. 5C is a two-dimensional optical photograph of a quartz NIL mold fabricated using the silicon mold of FIG. 4B.

FIG. 5C is a two-dimensional optical photograph of a quartz NIL mold fabricated using the silicon mold of FIG. 4B. Referring to FIG. 5C, a quartz NIL mold is fabricated using the silicon mold of FIG. 4B so that the quartz NIL mold has the same patterns as those of the silicon mold of FIG. 4B. A plurality of long band-shaped rectangular portions in the photograph are places where large patterns are formed, and a long band-shaped middle portion is a place where fine darker patterns, which are not clearly shown, are formed.

Since the method according to the present embodiment can easily fabricate the NIL mold required to realize sub-100 nm nanoelectronics on various substrates, the method can be used in the fields of organic and bio semiconductors as well as in the silicon semiconductor field in which deep ultraviolet (DUV) or extreme ultraviolet (EUV) lithography is often used, and thus it is expected to have great effect on these related fields.

As described above, since the method according to the present invention fabricates the quartz NIL mold using a mold such as the silicon substrate suitable for the EBL process, the NIL mold on which the fine patterns less than 100 nm are formed can be easily fabricated at low costs.

Since the method of the present invention forms the large patterns of a few micrometers (μm) on the silicon substrate and transfers the same to the NIL mold, the NIL mold on which the fine patterns less than 100 nm and the large patterns of a few micrometers (μm) are formed simultaneously can be fabricated.

Furthermore, since an NIL mold can be easily fabricated, the NIL process which can form sub-100 nm fine patterns over large areas of various materials more simply than existing EBL, focused ion beam lithography (FIBL), DUV, and EUV lithography can be applied to the fields of organic and bio semiconductors, wherein existing techniques are hardly applicable as well as to the silicon semiconductor field.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a nanoimprint lithography (NHL) mold comprising:
   forming patterns on a first substrate using an E-beam lithography (EBL) process and a photo-lithography process; and
   transferring the patterns formed on the first substrate to a second substrate using a nanoimprint lithography process to complete an NIL mold.

2. The method of claim 1, wherein the forming of the patterns on the first substrate comprises:
   coating an E-beam resist on the first substrate and forming E-beam resist patterns using the EBL process;
   forming photo resist (PR) patterns using a photo-lithography process on the first substrate with the E-beam resist patterns; and
   forming patterns on the first substrate using the E-beam resist patterns and the PR patterns formed on the first substrate.

3. The method of claim 2, wherein the E-beam resist patterns are less than 100 nm and the PR patterns are greater than 100 nm.

4. The method of claim 2, further comprising forming alignment keys on the first substrate to achieve alignment between the E-beam resist patterns and the PR patterns, before coating an E-beam resist.

5. The method of claim 4, wherein the alignment keys are formed on the first substrate using a photo-lithography process, and alignment marks for the E-beam resist patterns and the PR patterns are formed simultaneously.

6. The method of claim 2, wherein the E-beam resist and PR are not affected by each other during exposure and development processes.

7. The method of claim 6, wherein the E-beam resist is formed of hydrogen silsesquioxane (HSQ).

8. The method of claim 7, wherein the E-beam resist is spin-coated.

9. The method of claim 8, wherein the E-beam resist is coated to a thickness of 100 nm at a speed of 5000 rpm for 30 seconds.

10. The method of claim 8, wherein the E-beam resist patterns are formed by prebaking the E-beam resist for 2 minutes at temperatures of both 150° C. and 200° C. before exposure, irradiating an E-beam at 100 kV and 100 pA, and removing an unnecessary area of the E-beam resist with a developer.

11. The method of claim 10, wherein the developer is an aqueous tetramethylammonium hydroxide (TMAH)-based developer.

12. The method of claim 1, wherein the first substrate is a silicon substrate.

13. The method of claim 1, wherein the second substrate is a glass or quartz substrate.

14. The method of claim 1, wherein the NIL process is a thermal NIL process or an ultraviolet (UV) NIL process.

15. The method of claim 1, wherein the NIL mold is used to form sub-100 nm fine patterns on an element using an NIL process.

16. The method of claim 15, wherein the first substrate is a silicon substrate, the second substrate is a quartz substrate, and the NIL process is a thermal NIL process.

17. A method of claim 1 wherein the second substrate is transparent and configured for nanoprint lithographic processes.

* * * * *